(12) United States Patent
Kim et al.

(10) Patent No.: US 7,768,307 B2
(45) Date of Patent: Aug. 3, 2010

(54) CURRENT MODE LOGIC-COMPLEMENTARY METAL OXIDE SEMICONDUCTOR CONVERTER

(75) Inventors: Kyung-Hoon Kim, Kyoungki-do (KR); Dae-Han Kwon, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 12 days.

(21) Appl. No.: 12/005,443

(22) Filed: Dec. 26, 2007

(65) Prior Publication Data

US 2009/0058464 A1 Mar. 5, 2009

(30) Foreign Application Priority Data

Sep. 4, 2007 (KR) ...................... 10-2007-0089532

(51) Int. Cl.
 *H03K 19/0175* (2006.01)
(52) U.S. Cl. ........................................ 326/68; 326/115
(58) Field of Classification Search ................. 326/115, 326/127, 63, 68, 69, 71, 73
See application file for complete search history.

(56) References Cited

U.S. PATENT DOCUMENTS

| | | | | |
|---|---|---|---|---|
| 5,111,080 A | * | 5/1992 | Mizukami et al. | 326/30 |
| 5,332,935 A | * | 7/1994 | Shyu | 326/71 |
| 5,600,267 A | | 2/1997 | Wong et al. | |
| 5,606,268 A | * | 2/1997 | Van Brunt | 326/68 |
| 7,405,600 B2 | * | 7/2008 | Kim et al. | 326/115 |
| 2006/0006920 A1 | | 1/2006 | Lee | |

FOREIGN PATENT DOCUMENTS

| | | |
|---|---|---|
| JP | 07093565 | 4/1995 |
| JP | 09186564 | 7/1997 |

* cited by examiner

*Primary Examiner*—James Cho
(74) *Attorney, Agent, or Firm*—Blakely, Sokoloff, Taylor & Zafman

(57) ABSTRACT

A current mode logic (CML)-complementary metal oxide semiconductor (CMOS) converter prevents change of a duty ratio to stably operate during an operation for converting a CML level signal into a CMOS level signal. The CML-CMOS converter includes a reference level shifting unit configured to receive a CML signal swinging about a first reference level to shift a swing reference level to a second reference level; and an amplifying unit configured to amplify an output signal of the reference level shifting unit to output the amplified signal as a CMOS signal.

12 Claims, 4 Drawing Sheets

US 7,768,307 B2

CURRENT MODE LOGIC-COMPLEMENTARY METAL OXIDE SEMICONDUCTOR CONVERTER

CROSS-REFERENCE TO RELATED APPLICATIONS

The present invention claims priority to Korean patent application number 10-2007-0089532, filed on Sep. 4, 2007, which is incorporated by reference in its entirety.

BACKGROUND OF THE INVENTION

The present invention relates to a semiconductor device, and more particularly to a current mode logic (CML)-complementary metal oxide semiconductor (CMOS) converter for converting a CML level signal into a CMOS level signal. More specifically, the present invention relates to a CML-CMOS converter that can prevent a duty ratio from changing in a conversion process.

In a semiconductor device, a CML level signal is generally used as an input/output (I/O) interface signal for a high-speed signal such as a clock signal. The CML level means an average level determined by a predetermined direct current (DC) level or a specified reference. The CML level signal is a signal toggling with a predetermined amplitude or a predetermined swing range around a predetermined DC level called the CML level.

For example, in an apparatus for inputting/outputting the CML level signal, when a power supply voltage (VDD) level is 1.5 V and a ground voltage (VSS) level is 0 V, a CML level of the CML level signal is 1.25 V and a swing range thereof is 0.5 V.

Since the swing range of the CML level signal is relatively small as compared with a difference between the power supply voltage (VDD) level and the ground voltage (VSS) level in the apparatus for inputting/outputting the CML level signal, the apparatus for inputting/outputting the CML level signal can operate with a relatively low power supply and can operate with a very high switching speed of GHz or tens of GHz.

Since the apparatus for inputting/outputting the CML level signal simultaneously transfers two signals with different phases, it is insensitive to noise generated when signals are transferred. However, because of a relatively small swing range, the CML level signal cannot be used for an apparatus that should determine a logic level of data depending on a voltage level. That is, the CML level signal can be used for a clock signal, but cannot be used for other data signals.

Therefore, a CMOS level signal with a relatively large swing range is used for an apparatus for inputting/outputting a data signal. The CMOS level, similar to the CML level, means an average level determined by a predetermined DC level or a specific reference. The CMOS level signal is a signal toggling with predetermined amplitude or a predetermined swing range around a predetermined DC level called the CMOS level.

The CMOS level signal is different from the CML level signal in amplitude or a swing range based on the reference level.

In the above example, while a swing range of the CML level signal is approximately 0.5 V, the CMOS level signal is mainly a full swing signal, which swings between a power supply voltage VDD and a ground voltage VSS input to an apparatus, and thus has a relatively large swing range as compared with the CML level signal.

For example, in the above-described apparatus, when a power supply voltage VDD level is 1.5 V and a ground voltage VSS level is 0 V, the CMOS level signal has a swing range of 1.5 V about the CMOS level of 0.75 V.

Of course, the CMOS level signal should not necessarily be a full swing signal. However, since the CMOS level is mainly used for inputting/outputting a data signal, it has amplitude or a swing range enough to exactly determine a logic level with a variation of a voltage level.

Meanwhile, when a data signal is output from a semiconductor device, in particular, a synchronous dynamic random access memory (SDRAM), the data signal is generally synchronized with a clock. Similarly, when a data signal is input to the SDRAM, the data signal should be synchronized with a clock. That is, as described above, a data signal swinging about a CMOS level should be synchronized with a clock signal swinging around a CML level in order to perform an input or output operation.

Therefore, an input/output buffer of the SDRAM includes a CML-CMOS converter for converting a CML level signal into a CMOS level signal.

FIG. 1 is a circuit diagram of a conventional CML-CMOS converter for converting a CML level signal into a CMOS level signal. Referring to FIG. 1, a conventional CML-CMOS converter 100 has a structure of a general OP amplifier.

Specifically, the CML-CMOS converter 100 includes a first NMOS transistor N1, a second NMOS transistor N2, a third NMOS transistor N3, and first and second PMOS transistors P1 and P2. The first NMOS transistor N1 has a gate receiving a CML level signal CML_S, a drain connected to a driving node DN, and a source connected to a common node COMN. The first NMOS transistor N1 controls an amount of current flowing between the driving node DN and the common node COMN in response to the CML level signal CML_S. The second NMOS transistor N2 has a gate receiving a CML level inversion signal CML_SB, a drain connected to an output node OUT_ND, and a source connected to the common node COMN. The second NMOS transistor N2 controls an amount of current flowing between the output node OUT_ND and the common node COMN in response to the CML level inversion signal CML_SB. The third NMOS transistor N3 has a gate receiving a bias voltage BIAS, a drain connected to the common node COMN, and a source connected to a ground voltage (VSS) terminal. The third NMOS transistor N3 controls connection between the common node COMN and the ground voltage VSS terminal in response to the bias voltage BIAS to supply a sink current to the common node COMN. The first and second PMOS transistors P1 and P2 are connected in a current mirror configuration between the driving node DN and the output node OUT_ND to supply a source current to the driving node DN and the output node OUT_ND and simultaneously to control such that the same amount of current flows therethrough.

An operation of the conventional CML-CMOS converter 100 for converting the CML level signal into the CMOS level signal will now be described.

The first and second NMOS transistors N1 and N2 control an amount of current flowing between the driving node DN and the common node COMN and an amount of current flowing between the output node OUT_ND and the common node COMN in response to a level of a CML level signal CML_S and a level of a CML level inversion signal CML_SB, respectively. The level of the CML level signal CML_S always has a phase opposite to the level of the CML level inversion signal CML_SB. Thus, when the level of the CML level signal CML_S increases, the CML level inversion signal CML_SB decreases. Therefore, a driving force of the first NMOS transistor N1 increases to thereby increase an amount of current flowing between the driving node DN and the common node COMN while a driving force of the second NMOS transistor N2 decreases to thereby decrease an amount of current flowing between the output node OUT_ND and the common node COMN. That is, a voltage level of the driving node DN decreases while a voltage level of the output node OUT_ND increases.

On the other hand, when the level of the CML level signal CML_S decreases, the level of the CML level inversion signal CML_SB increases. Therefore, an amount of current flowing between the driving node DN and the common node COMN decreases while an amount of current flowing between the output node OUT_ND and the common node COMN increases. That is, a voltage level of the driving node DN increases while a voltage level of the output node OUT_ND decreases.

The CML-CMOS converter 100 amplifies the CML level signal CML_S as much as an amplification rate determined by sizes of its internal transistors (the first to third NMOS transistors N1, N2 and N3 and the first and second PMOS transistors P1 and P2) to output the amplified signal as a CMOS level signal CMOS_S.

However, since the CML-CMOS converter 100 is supplied with the power supply voltage VDD and the ground voltage VSS, a level of the CMOS level signal CMOS_S output through the output node OUT_ND cannot deviate from the level between the power supply voltage VDD and the ground voltage VSS. At the same time, because of a threshold voltage VTH of the third NMOS transistor N3 for supplying a sink current to the common node COMN, the level of the CMOS level signal CMOS_S output through the output node OUT_ND cannot decrease below a threshold voltage VTH level of the third NMOS transistor N3 added to the level of the ground voltage VSS level.

That is, the CMOS level signal CMOS_S output through the output node OUT_ND of the CML-CMOS converter 100 has a waveform as shown in FIG. 2.

FIG. 2 is a timing diagram of signals according to operation of the conventional CML-CMOS converter of FIG. 1.

Referring to FIG. 2, in a waveform of a signal according to an operation of the conventional CML-CMOS converter 100, the CMOS level signal CMOS_S is not disposed in a center between the power supply voltage VDD and the ground voltage VSS, but inclines toward the power supply voltage VDD.

Specifically, when a power supply voltage VDD level is 1.5 V and a ground voltage VSS level is 0 V, the CML level signal CML_S swings with a swing range of 0.5 V about a CML level of 1.25 V, that is, between 1.5 V and 1 V.

When the amplification rate of the CMOS level signal CMOS_S generated by amplifying the CML level signal CML_S is appropriately adjusted, the maximum level reaches 1.5 V of the power supply voltage VDD. However, the minimum level cannot reach 0 V of the ground voltage VSS and is maintained at 0.3 V, which is the threshold voltage level VTH of the third NMOS transistor N3. That is, the CMOS level signal CMOS_S swings between 1.5 V and 0.3 V.

Therefore, the CMOS level of the CMOS level signal CMOS_S output from the conventional CML-CMOS converter 100 is 0.9 V, which is higher than 0.75 V that is VDD/2.

However, the CMOS level signal CMOS_S output from the conventional CML-CMOS converter 100 is not used as an analog signal, but is converted into a digital signal that is determined as a logic 'high' or a logic 'low'. That is, the CMOS level signal CMOS_S output from the CML-CMOS converter 100 is input to an inverter that uses a power supply voltage VDD and a ground voltage VSS as power and an output of the inverter is used.

The inverter is generally used in a semiconductor device and includes one NMOS transistor and one PMOS transistor. The logic determining level of the inverter is 0.75 V, half the difference between 1.5 V of the power supply voltage VDD and 0 V of the ground voltage VSS. The logic determining level is a reference level for determining which logic level of an input signal has logic 'high' or logic 'low'. For example, when a signal of a voltage level lower than the logic determining level is input, a signal of a logic 'low' level (equal to VSS) is output, and when a signal of a voltage level higher than the logic determining level is input, a signal of a logic 'high' level (equal to VDD) is output.

When the CMOS level signal CMOS_S swinging about 0.9 V, which is an output signal of the conventional CML-CMOS inverter 100, is input to the above-mentioned inverter, its duty ratio is changed as compared with the case that the CMOS level signal CMOS_S that fully swings about 0.75 V is input.

That is, according to the conventional CML-CMOS converter 100, during an operation for converting the CML level signal CML_S into the CMOS level signal CMOS_S, the CMOS level cannot correspond to half the difference between the power supply voltage VDD level and the ground voltage VSS level, causing a change of a duty ratio of the CML level signal CML_S.

SUMMARY OF THE INVENTION

Embodiments of the present invention are directed to providing a CML-CMOS converter that prevents change of a duty ratio to stably operate during an operation for converting a CML level signal into a CMOS level signal.

In accordance with an aspect of the present invention, there is provided a current mode logic (CML)-complementary metal oxide semiconductor (CMOS) converter which includes a reference level shifting unit configured to receive a CML signal swinging about a first reference level to shift a swing reference level to a second reference level; and an amplifying unit configured to amplify an output signal of the reference level shifting unit to output the amplified signal as a CMOS signal.

In accordance with an aspect of the present invention, there is provided a current mode logic (CML)-complementary metal oxide semiconductor (CMOS) converter which includes a first reference level shifting unit configured to receive a positive CML signal swinging about a first reference level to shift a swing reference level to a second reference level, a second reference level shifting unit configured to receive a negative CML signal swinging about the first reference level to shift the swing reference level to the second reference level, a first CMOS inverting unit configured to amplify a swing range of an output signal of the first reference level shifting unit to a CMOS level, a second CMOS inverting unit configured to amplify a swing range of an output signal of the second reference level shifting unit to a CMOS level to output the amplified second reference level shifting unit output signal as a CMOS signal, a first biasing unit configured to provide a source current to the first and second CMOS inverting units in response to an output signal of the first CMOS inverting unit, and a second biasing unit configured to provide a sink current to the first and second CMOS inverting units in response to the output signal of the first CMOS inverting unit.

DESCRIPTION OF SPECIFIC EMBODIMENTS

Figure 1:
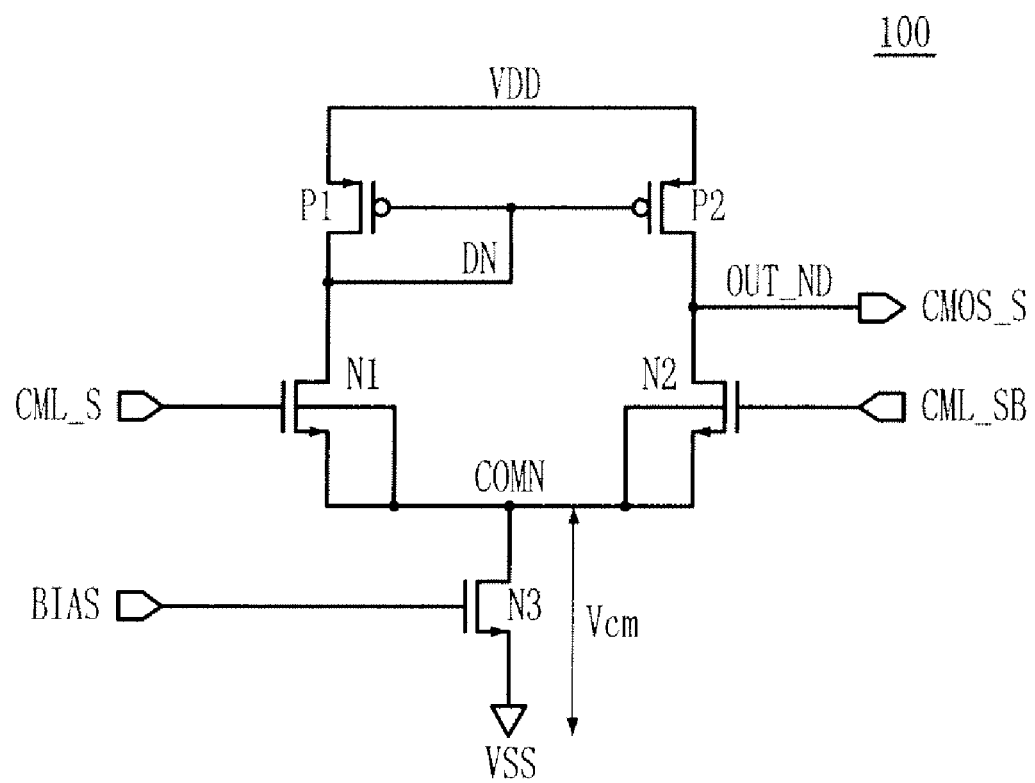
FIG. 1 is a circuit diagram of a conventional CML-CMOS converter for converting a CML level signal into a CMOS level signal.
Figure 2:
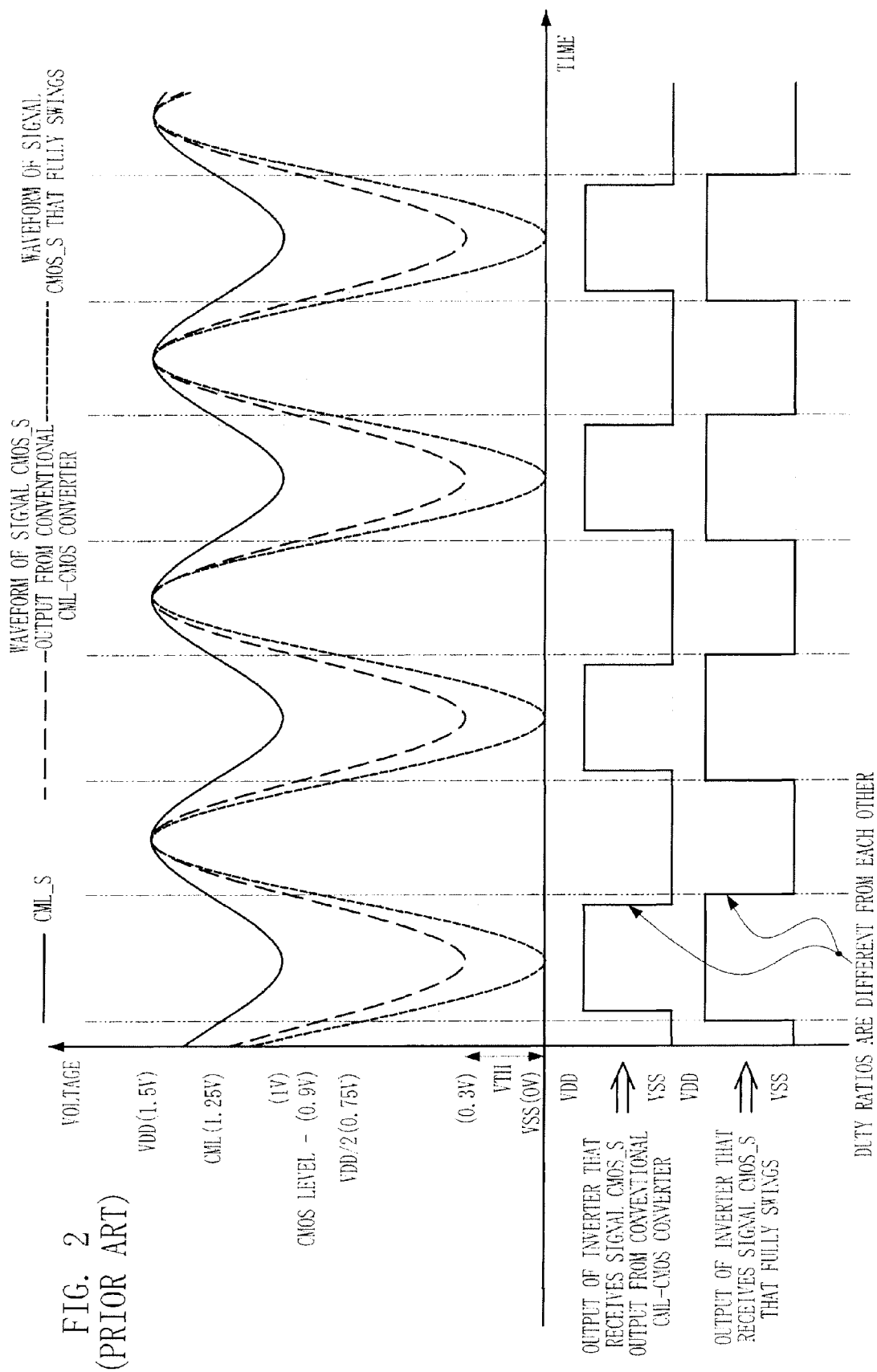
FIG. 2 is a timing diagram of signals according to operation of the conventional CML-CMOS converter of FIG. 1.

Hereinafter, a CML-CMOS converter in accordance with the present invention will be described in detail with reference to the accompanying drawings. In the drawings, like reference numerals or reference symbols denote like elements.

Figure 3:
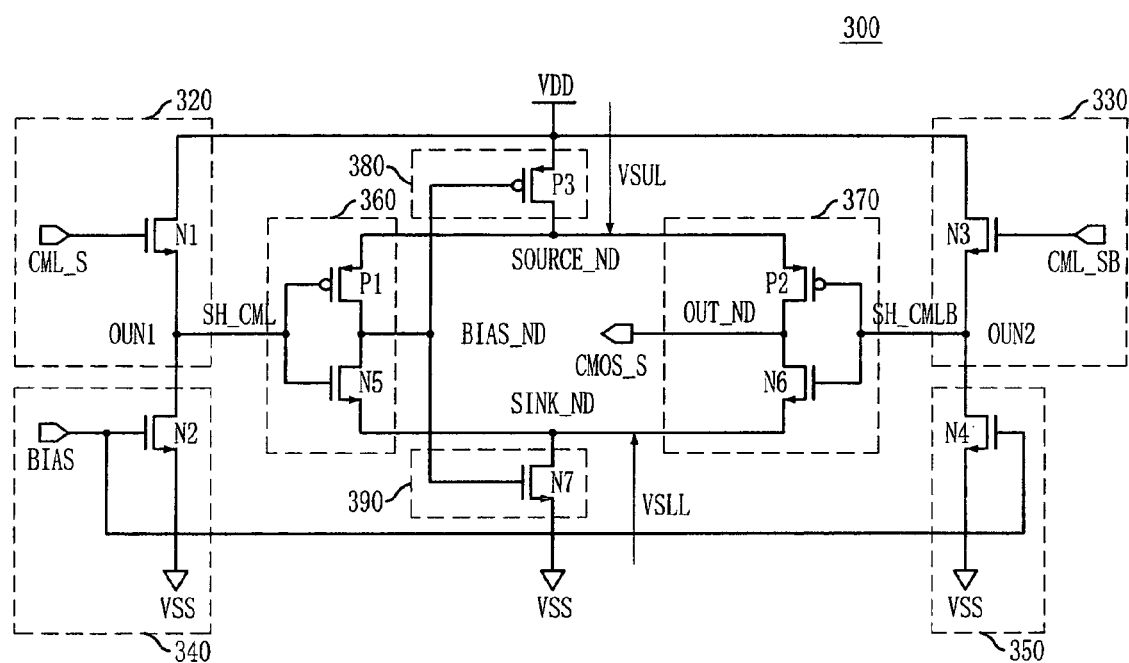
FIG. 3 is a circuit diagram of a CML-CMOS converter for converting a CML level signal into a CMOS level signal in accordance with an embodiment of the present invention.

FIG. 3 is a circuit diagram of a CML-CMOS converter for converting a CML level signal into a CMOS level signal in accordance with an embodiment of the present invention.

Referring to FIG. 3, a CML-CMOS converter 300 includes a first reference level shifting unit 320, a second reference level shifting unit 330, a first CMOS inverting unit 360, a second CMOS inverting unit 370, a first biasing unit 380, and a second biasing unit 390. The first reference level shirting unit 320 receives a positive CML signal CML_S swinging about a first reference level to shift a swing reference level to a second reference level. The second reference level shifting unit 330 receives a negative CML signal CML_SB swinging about a first reference level to shift the swing reference level to a second reference level. The first CMOS inverting unit 360 amplifies a swing range of an output signal SH_CML of the first reference level shifting unit 320 to a CMOS level. The second CMOS inverting unit 370 amplifies a swing range of an output signal SH_CMLB of the second reference level shifting unit 330 to a CMOS level to output the output signal SH_CMLB as a CMOS signal CMOS_S. The first biasing unit 380 provides a source current to the first and second CMOS inverting units 360 and 370 in response to an output signal of the first CMOS inverting unit 360. The second biasing unit 390 provides a sink current to the first and second CMOS inverting units 360 and 370 in response to the output signal of the first CMOS inverting unit 360.

The CML_CMOS converter 300 further includes first and second operation control units 340 and 350. The first operation control unit 340 controls on/off operation of the first reference level shifting unit 320 in response to a bias voltage BIAS. The second operation control unit 350 controls on/off operation of the second reference level shifting unit 330 in response to the bias voltage BIAS.

The first reference level shifting unit 320 includes a first NMOS transistor N1 having a gate receiving a positive CML signal CML_S, a drain connected to a power supply voltage VDD terminal, and a source connected to a first output node OUN1. The first NMOS transistor N1 controls an amount of current flowing between the power supply voltage VDD terminal and the first output node OUN1 in response to the positive CML signal CML_S.

The second reference level shifting unit 330 includes a second NMOS transistor N3 having a gate receiving a negative CML signal CML_SB, a drain connected to the power supply voltage VDD terminal, and a source connected to a second output node OUN2. The second NMOS transistor N3 controls an amount of current flowing between the power supply voltage VDD terminal and the second output node OUN2 in response to the negative CML signal CML_SB.

The first CMOS inverting unit 360 includes a first PMOS transistor P1 and a third NMOS transistor N5. The first PMOS transistor P1 has a gate receiving the output signal SH_CML of the first reference level shifting unit 320, a source connected to a sourcing node SOURCE_ND, and a drain connected to a biasing control node BIAS_ND. The first PMOS transistor P1 controls an amount of current flowing between the sourcing node SOURCE_ND and the biasing control node BIAS_ND in response to the output signal SH_CML of the first reference level shifting unit 320. The third NMOS transistor N5 has a gate receiving the output signal SH_CML of the first reference level shifting unit 320, a drain connected to the biasing control node BIAS_ND, and a source connected to a sinking node SINK_ND. The third NMOS transistor N5 controls an amount of current flowing between the biasing control node BIAS_ND and the sinking node SINK_ND in response to the output signal SH_CML of the first reference level shifting unit 320.

The second CMOS inverting unit 370 includes a second PMOS transistor P2 and a fourth NMOS transistor N6. The second PMOS transistor P2 has a gate receiving the output signal SH_CMLB of the second reference level shifting unit 330, a source connected to the sourcing node SOURCE_ND, and a drain connected to an output node OUT_ND. The second PMOS transistor P2 controls an amount of current flowing between the sourcing node SOURCE_ND and the output node OUT_ND in response to the output signal SH_CMLB of the second reference level shifting unit 330. The fourth NMOS transistor N6 has a gate receiving the output signal SH_CMLB of the second reference level shifting unit 330, a drain connected to the output node OUT_ND, and a source connected to the sinking node SINK_ND. The fourth NMOS transistor N6 controls an amount of current flowing between the output node OUT_ND and the sinking node SINK_ND in response to the output signal SH_CMLB of the second reference level shifting unit 330.

The first biasing unit 380 includes a third PMOS transistor P3 having a gate receiving a voltage of the biasing control node BIAS_ND, a source connected to the power supply voltage VDD terminal, and a drain connected to the sourcing node SOURCE_ND. The third PMOS transistor P3 controls an amount of current flowing between the power supply voltage VDD terminal and the sourcing node SOURCE_ND in response to the voltage of the biasing control node BIAS_ND.

The second biasing unit 390 includes a fifth NMOS transistor N7 having a gate receiving the voltage of the biasing control node BIAS_ND, a drain connected to the sinking node SINK_ND, and a source connected to a ground voltage VSS terminal. The fifth NMOS transistor N7 controls an amount of current flowing between the sinking node SINK_ND and the ground voltage VSS terminal in response to the voltage of the biasing control node BIAS_ND.

The configuration of the CML-CMOS converter 300 in accordance with an embodiment of the present invention may be classified as following.

The CML-CMOS converter 300 includes a reference level shifting unit (320 and 330) for shifting a swing reference level to a second reference level in response to CML signals CML_S and CML_SB that swing about a first reference level and an amplifying unit (360, 370, 380 and 390) for amplifying swing ranges of output signals SH_CML and SH_CMLB of the reference level shifting units 320 and 330 to output the signals as CMOS signals CMOS_S.

The CML-CMOS converter 300 further includes an operation control unit (340 and 350) for controlling on/off operation of the reference level shifting unit (320 and 330) in response to a bias voltage BIAS.

An operation of the CML-CMOS converter 300 in accordance with an embodiment of the present invention will be described.

A bias voltage BIAS is always maintained at logic 'high' when a power supply voltage VDD is supplied to a semiconductor device and is maintained at more than a predetermined level. Therefore, it may be supposed that the first and second reference level shifting units 320 and 330 always operate.

The first reference level shifting unit 320 includes the first NMOS transistor N1 having a gate receiving a positive CML signal CML_S and a drain receiving a power supply voltage VDD. A voltage level applied to the first output node OUN1 connected to the source of the first NMOS transistor N1 is represented as the following Equation 1.

$$V_{DS} = V_{GS} - V_T \quad \text{Eq. 1}$$

A voltage level deducted from a voltage level of a positive CML signal CML_S applied to the gate of the first NMOS transistor N1 by a threshold voltage $V_T$ level of the first NMOS transistor N1 is a voltage level applied to the first output node OUN1 connected to the source of the first NMOS transistor N1.

For example, when a threshold voltage $V_T$ level of the first NMOS transistor N1 is 0.5 V, a voltage level of a positive CML_S swings between 1.5 V of a power supply voltage VDD and 1 V. Therefore, a voltage level applied to the first output node OUN1 connected to the source of the first NMOS transistor N1 swings between 1 V and 0.5 V.

Accordingly, when a voltage level of a positive CML signal CML_S applied to the gate of the first NMOS transistor N1 swings between 1.5 V and 1 V about 1.25 V of the CML level, a voltage level applied to the first output node OUN1 connected to the source of the first transistor N1 swings between 1 V and 0.5 V about 0.75 V that is half the difference between a power supply voltage VDD level and a ground voltage VSS level.

That is, when a positive CML signal CML_S with a swing range of 0.5 V about 1.25 V of a CML level is input to the first reference level shifting unit 320, the output signal SH_CML maintains the swing range of 0.5 V and a reference level thereof is shifted to 0.75 V.

The second reference level shifting unit 330 has a configuration similar to the first reference level shifting unit 320, but has a difference in that a negative CML signal CML_SB instead of a positive CML signal CML_S is input to the gate and the source is connected to the second output node OUN2. Since the threshold voltage $V_T$ levels of the first and second NMOS transistors N1 and N3 are equal to each other, substantial operation is completely the same. That is, when a negative CML signal CML_SB applied to the gate of the second NMOS transistor N3 has a swing range of 0.5 V about 1.25 V of the CML level, a voltage level of the output signal SH_CMLB applied to the second output node OUN2 connected to the source of the second NMOS transistor N3 maintains a swing range of 0.5 V and a reference level thereof is shifted to 0.75 V, similarly to a voltage level of the output signal SH_CML applied to the first output node OUN1.

However, since a positive CML signal CML_S and a negative CML signal CML_SB have phases opposite to each other, a signal SH_CML output from the first reference level shifting unit 320 in response to the positive CML signal CML_S and a signal SH_CMLB output from the second reference level shifting unit 330 in response to the negative CML signal CML_SB have phases opposite to each other.

That is, when a voltage level of a signal SH_CML output from the first reference level shifting unit 320 is 1 V, a voltage level of a signal SH_CMLB output from the second reference level shifting unit 330 is 0.5 V. On the other hand, when a voltage level of a signal SH_CML output from the first reference level shifting unit 320 is 0.5 V, a voltage level of a signal SH_CMLB output from the second reference level shifting unit 330 is 1 V.

In this embodiment, a threshold voltage $V_T$ of the first and second NMOS transistors N1 and N3 is 0.5 V, but a threshold voltage $V_T$ level may vary depending on a material used for manufacturing the first and second NMOS transistors N1 and N3. In the case of a semiconductor device using a power supply voltage VDD level of 1.8 V higher than 1.5 V, a signal swinging about a CML level of 1.55 V can instead swing about a level of 0.9 V, which is half the difference between a power supply voltage VDD level and a ground voltage VSS level by appropriately using the property of a material used for the first and second NMOS transistors N1 and N3 such that a threshold voltage level $V_T$ becomes 0.65 V. That is, a shift range of a reference level by the first and second reference level shifting units 320 and 330 may be controlled if necessary.

In the first CMOS inverting unit 360, the first PMOS transistor P1 and the third NMOS transistor N5 are connected in series between the source node SOURCE_ND and the sink node SINK_ND and an output signal is generated from the biasing control node BIAS_ND, i.e., a connection node between the first PMOS transistor P1 and the third NMOS transistor N5. Therefore, the first CMOS inverting unit 360 has a configuration similar to a general inverter.

Similarly, in the second CMOS inverting unit 370, the second PMOS transistor P2 and the fourth NMOS transistor N6 are connected in series between the source node SOURCE_ND and the sink node SINK_ND and an output signal is generated from the output node OUT_ND, i.e., a connection node between the second PMOS transistor P2 and the fourth NMOS transistor N6. Therefore, the second CMOS inverting unit 370 has a configuration similar to a general inverter.

Accordingly, the first and second CMOS inverting units 360 and 370 may perform the same operation. However, while a signal output from the first CMOS inverting unit 360 and applied to the biasing control node BIAS_ND is used for controlling an operation of the first and second biasing units 380 and 390, a signal output from the second CMOS inverting unit 370 and applied to the output node OUT_ND is a CMOS level signal CMOS_S, which is a final result of the CML-CMOS converter 300.

More specifically, a voltage level of a signal applied to the biasing node BIAS_ND vary depending on which of the first PMOS transistor P1 and the third NMOS transistor N5 of the first CMOS inverting unit 360 a voltage level of an output signal SH_CML of the first reference level shifting unit 320 input to the first CMOS inverting unit 360 turns on with higher force.

For example, when a voltage level of the output signal SH_CML of the first reference level shifting unit 320 is 1 V, the voltage level is closer to a power supply voltage VDD of 1.5 V than a ground voltage VSS of 0 V, and thus turns on the third NMOS transistor N5 with higher force rather than the first PMOS transistor P1. That is, a voltage level of a signal applied to the biasing node BIAS_ND becomes relatively closer to a ground voltage VSS.

A signal applied to the biasing node BIAS_ND is applied to the gate of the third PMOS transistor P3 of the first biasing unit 380 and the gate of the fifth NMOS transistor N7 of the second biasing unit 390. When a voltage level of a signal applied to the biasing node BIAS_ND becomes relatively closer to a ground voltage VSS, the third PMOS transistor P3 is turned on with higher force in the first biasing unit 380 rather than the second biasing unit 390. That is, a voltage level of a signal applied to the source node SOURCE_ND increases relatively more to become closer to a power supply voltage VDD level.

Since a voltage level of an output signal SH_CMLB of the second reference level shifting unit 330 input to the second CMOS inverting unit 370 has a phase opposite to a voltage level of an output signal SH_CML of the first reference level shifting unit 320 input to the first CMOS inverting unit 360, a voltage level of the output signal SH_CMLB of the second reference level shifting unit 330 is 0.5 V, thereby turning on the second PMOS transistor P2 of the second PMOS transistor P2 and the fourth NMOS transistor N6 with higher force.

However, since the source node SOURCE_ND is connected to the source of the second PMOS transistor P2, and a voltage level of a signal applied to the source node SOURCE_ND increases relatively more due to an operation of the first CMOS inverting unit 360 and becomes a level VSUL close to a power supply voltage VDD level, a CMOS level signal CMOS_S output through the output node OUT_ND connected to the drain of the second PMOS transistor P2 has a level VSUL close to a power supply voltage VDD level.

In addition, operations of the first and second inverting units 360 and 370 and the first and second biasing units 380 and 390 are the same as the above-described operation even when a voltage level of the output signal SH_CML of the first reference level shifting unit 320 is 0 V and a voltage level of the output signal SH_CMLB of the second reference level shifting unit 330 is 1 V. Therefore, a CMOS level signal CMOS_S may have a level VSLL close to a ground voltage VSS level by the second biasing unit 390.

That is, a CMOS level signal CMOS_S has a swing range relatively amplified compared to a swing range of the positive CML signal CML_S input through the first reference level shifting unit 320 and swings between a level VSUL close to a power supply voltage VDD level and a level VSLL close to a ground voltage VSS level.

The third PMOS transistor P3 provided in the first biasing unit 380 to control an amount of current flowing between a power supply voltage VDD terminal and a source node SOURCE_ND has a threshold voltage $V_T$ level equal to that of the fifth NMOS transistor N7 provided in the second biasing unit 390 to control an amount of current flowing between a ground voltage VSS terminal and the sinking node SINK_ND.

The source node SOURCE_ND has a level VSUL that is close to a power supply voltage VDD level by a threshold voltage $V_T$ level of the third PMOS transistor P3. The sinking node SINK_ND has a level VSLL that is close to a ground voltage VSS level by a threshold voltage $V_T$ level of the fifth NMOS transistor N7. The level VSUL and the level VSLL are symmetrical with reference to half the difference between a power supply voltage VDD level, and a ground voltage VSS level.

That is, a CMOS level of a CMOS level signal CMOS_S that is output from the second CMOS inverting unit 370 and swings between a level VSUL and a level VSLL corresponds to half the difference between a power supply voltage VDD level and a ground voltage VSS level.

As described above, a CMOS level signal CMOS_S output from the second CMOS inverting unit 370 cannot fully swing between a power supply voltage VDD level and a ground voltage VSS level. This is because the third PMOS transistor P3 provided in the first biasing unit 380 to control an amount of current flowing between a power supply voltage VDD terminal and the source node SOURCE_ND and the fifth NMOS transistor N7 provided in the second biasing unit 390 to control an amount of current flowing between a ground voltage VSS terminal and the sinking node SINK_ND each maintain a predetermined threshold voltage $V_T$ level. When ingredients of a material that forms the third PMOS transistor P3 and the fifth NMOS transistor N7 are appropriately adjusted to minimize their threshold $V_T$ level, the level VSUL close to a power supply voltage VDD and the level VSLL close to a ground voltage VSS may be less important to determine a logic level of data.

That is, since a voltage level variation according to a swing range of a CMOS level signal CMOS_S, which is output from the second CMOS inverting unit 370 to swing between the level VSUL and the level VSLL, is much greater than the logic determining level as described above, the CMOS level signal CMOS_S can have a swing range enough to exactly determine a logic level of data.

Figure 4:
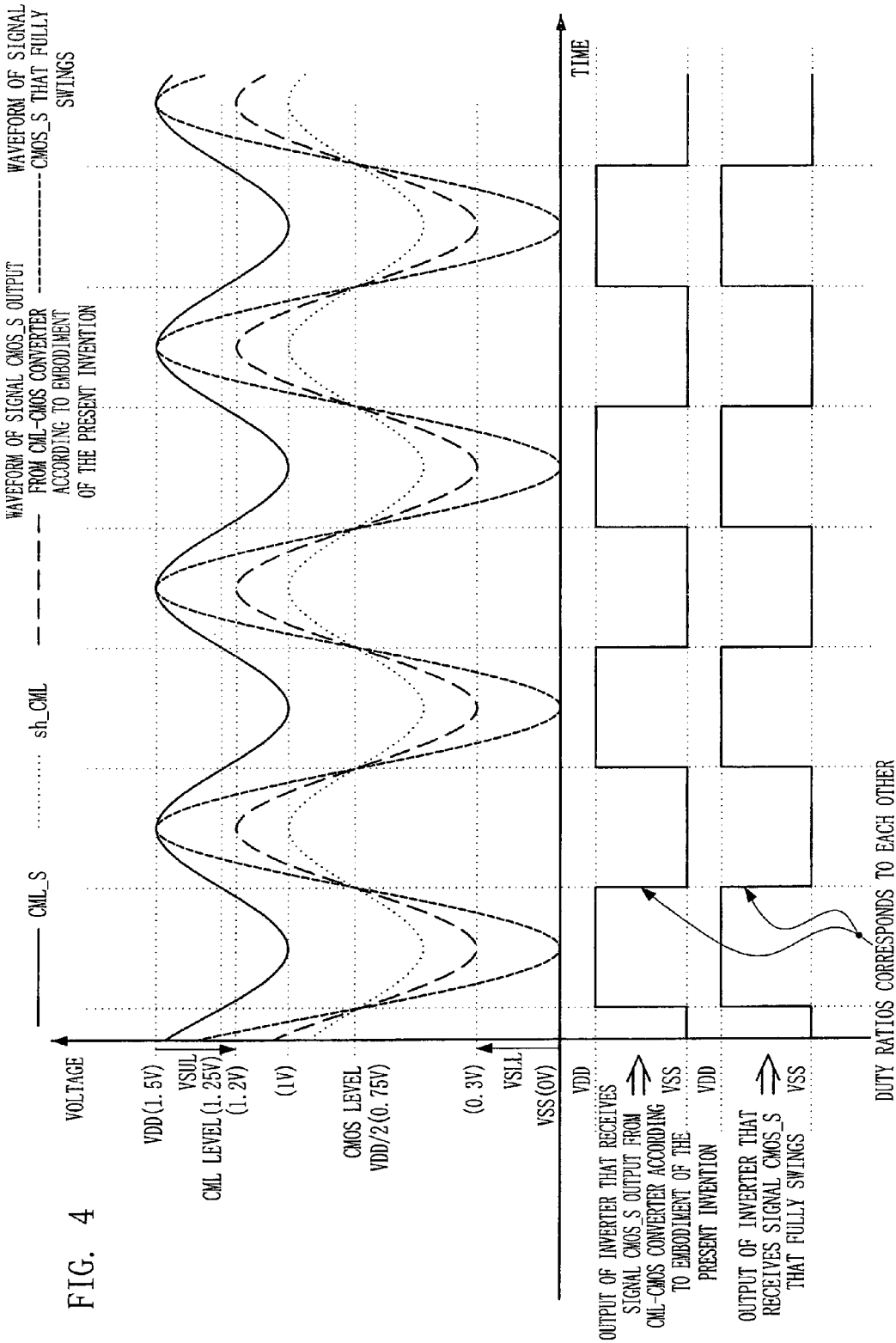
FIG. 4 is a timing diagram of signals according to operation of the CML-CMOS converter of FIG. 3 in accordance with an embodiment of the present invention.

FIG. 4 is a timing diagram of signals according to operation of the CML-CMOS converter of FIG. 3 in accordance with an embodiment of the present invention.

Referring to FIG. 4, in a waveform of a signal according to the CML-CMOS converter 300, a CMOS level signal CMOS_S swings about a center VDD/2 between a power supply voltage VDD and a ground voltage VSS.

In detail, when a power supply voltage VDD level is 1.5 V and a ground voltage VSS level is 0 V, a waveform of a CML level signal CML_S swings with a swing range of 0.5 V about a CML level of 1.25 V, that is, swings between 1.5 V and 1 V, as described in a prior art.

When the CML level signal CML_S is input to the first reference level shifting unit 320 to shift the CML level of 1.25 V to 0.75, an output signal SH_CML of the first reference level shifting unit 320 has a swing range of 0.5 about 0.75 V of half the difference between 1.5 V of a power supply voltage VDD and 0 V of a ground voltage VSS, that is, swings between 1 V and 0.5 V.

The output signal SH_CML of the first reference level shifting unit 320 is input to the first CMOS inverting unit 360 and amplified by the first and second biasing units 380 and 390 to be output as a CMOS level signal CMOS_S through the second CMOS inverting unit 370. The CMOS level signal CMOS_S swings about 0.75 V of half the difference between 1.5 V of a power supply voltage VDD level and 0 V of a ground voltage VSS level, but a swing range thereof is 0.9 V. That is, the CMOS level signal CMOS_S swings between 1.2 V of the level VSUL and 0.3 V of the level VSLL.

As described in the conventional CML-CMOS converter, the CMOS level signal CMOS_S output from the CML-CMOS converter 300 is not used as an analog signal, but is converted into a digital signal that is determined as logic 'high' or logic 'low'. A logic determining level of an inverter used for converting the CMOS level signal CMOS_S of an analog signal into a digital signal is half the difference between a power supply voltage VDD level and a ground voltage VSS level.

Therefore, since a CMOS level of the CMOS level signal CMOS_S output from the CML-CMOS converter 300 corresponds to a logic determining level of the inverter, when the CMOS level signal CMOS_S output from the CML-CMOS converter 300 is input to the inverter, the CMOS level signal CMOS_S has the same duty ratio as the case that the CMOS level signal CMOS_S that fully swings is input to the inverter. That is, in the CML-CMOS converter 300 in accordance with an embodiment of the present invention, the duty ratio of the CMOS level signal CMOS_S does not change.

As described above, during an operation for converting a CML level signal CML_S into a CMOS level signal CMOS_S, a reference level of the CMOS level signal CMOS_S can correspond to half the difference between a power supply voltage VDD level and a ground voltage VSS level, thereby preventing a duty ratio of the CMOS level signal CMOS_S from changing. That is, the CML-CMOS converter can operate stably.

While the present invention has been described with respect to the specific embodiments, it will be apparent to those skilled in the art that various changes and modifications may be made without departing from the spirit and scope of the invention as defined in the following claims. For, example, positions and types of logic gates and transistors of the above-described embodiments may vary depending on polarity of input signals.

What is claimed is:

1. A current mode logic (CML)-complementary metal oxide semiconductor (CMOS) converter, comprising:
 a reference level shifting unit configured to receive a CML signal swinging about a first reference level to shift a swing reference level to a second reference level while maintaining the voltage swing width of the CML signal;
 an amplifying unit configured to amplify an output signal of the reference level shifting unit to output the amplified signal as a CMOS signal; and
 an operation control unit configured to control on/off operation of the reference level shifting unit in response to a bias voltage.

2. The CML-CMOS converter as recited in claim 1, wherein the reference level shifting unit includes a transistor having a gate receiving the CML signal, a drain connected to a power supply voltage terminal, and a source connected to an output node to control an amount of current flowing between the power supply voltage terminal and the output node in response to a voltage level of the CML signal.

3. The CML-CMOS converter as recited in claim 2, wherein a voltage level difference between the first reference level and the second reference level is determined depending on a threshold voltage level of the transistor.

4. A current mode logic (CML)-complementary metal oxide semiconductor (CMOS) converter, comprising:
 a first reference level shifting unit configured to receive a positive CML signal swinging about a first reference level to shift a swing reference level to a second reference level;
 a second reference level shifting unit configured to receive a negative CML signal swinging about the first reference level to shift the swing reference level to the second reference level;
 a first CMOS inverting unit configured to amplify a swing range of an output signal of the first reference level shifting unit to a CMOS level;
 a second CMOS inverting unit configured to amplify a swing range of an output signal of the second reference level shifting unit to a CMOS level to output the amplified second reference level shifting unit output signal as a CMOS signal;
 a first biasing unit configured to provide a source current to the first and second CMOS inverting units in response to an output signal of the first CMOS inverting unit; and
 a second biasing unit configured to provide a sink current to the first and second CMOS inverting units in response to the output signal of the first CMOS inverting unit.

5. The CML-CMOS converter as recited in claim 4, further comprising:
 a first operation control unit configured to control on/off operation of the first reference level shifting unit in response to a bias voltage; and
 a second operation control unit configured to control on/off operation of the second reference level shifting unit in response to the bias voltage.

6. The CML-CMOS converter as recited in claim 4, wherein the first reference level shifting unit includes a first transistor having a gate receiving the positive CML signal, a drain connected to a power supply voltage terminal, and a source connected to a first output node to control an amount of current flowing between the power supply voltage terminal and the first output node in response to a voltage level of the applied positive CML signal.

7. The CML-CMOS converter as recited in claim 6, wherein the second reference level shifting unit includes a second transistor having a gate receiving the negative CML signal, a drain connected to the power supply voltage terminal, and a source connected to a second output node to control an amount of current flowing between the power supply voltage terminal and the second output node in response to a voltage level of the applied negative CML signal.

8. The CML-CMOS converter as recited in claim 7, wherein the first and second transistors have a same threshold voltage level and a voltage level difference between the first and second reference levels is determined depending on the threshold voltage level.

9. The CML-CMOS converter as recited in claim 4, wherein the first CMOS inverting unit includes:
 a first transistor having a gate receiving the output signal of the first reference level shifting unit, a source connected to a sourcing node, and a drain connected to a biasing control node to control an amount of current flowing between the sourcing node and the biasing control node in response to the output signal of the first reference level shifting unit; and
 a second transistor having a gate receiving the output signal of the first reference level shifting unit, a drain connected to the biasing control node, and a source connected to a sinking node to control an amount of current flowing between the biasing control node and the sinking node in response to the output signal of the first reference level shifting unit.

10. The CML-CMOS converter as recited in claim 9, wherein the second CMOS inverting unit includes:
 a third transistor having a gate receiving the output signal of the second reference level shifting unit, a source connected to the sourcing node, and a drain connected to an output node to control an amount of current flowing between the sourcing node and the output node in response to the output signal of the second reference level shifting unit; and
 a fourth transistor having a gate receiving the output signal of the second reference level shifting unit, a drain connected to the output node, and a source connected to the sinking node to control an amount of current flowing between the output node and the sinking node in response to the output signal of the second reference level shifting unit.

11. The CML-CMOS converter as recited in claim 9, wherein the first biasing unit includes a third transistor having a gate receiving a voltage of the biasing control node, a source connected to a power supply voltage terminal, and a drain connected to the sourcing node to control an amount of current flowing between the power supply voltage terminal and the sourcing node.

12. The CML-CMOS converter as recited in claim 9, wherein the second biasing unit includes a third transistor having a gate receiving the voltage of the biasing control node, a drain connected to the sinking node, and a source connected to a ground voltage terminal to control an amount of current flowing between the sinking node and the ground voltage terminal.

* * * * *